US009460685B2

(12) United States Patent
Cho et al.

(10) Patent No.: US 9,460,685 B2
(45) Date of Patent: Oct. 4, 2016

(54) DISPLAY DRIVER INTEGRATED CIRCUIT WITH MULTIPLE DATA PATHS

(71) Applicant: Samsung Electronics Co., Ltd., Suwon-Si, Gyeonggi-Do (KR)

(72) Inventors: Kyung-Sang Cho, Incheon (KR); Woo-Hyun Shim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 155 days.

(21) Appl. No.: 14/186,140

(22) Filed: Feb. 21, 2014

(65) Prior Publication Data

US 2014/0247253 A1  Sep. 4, 2014

(30) Foreign Application Priority Data

Mar. 4, 2013  (KR) .......................... 10-2013-0022598

(51) Int. Cl.
*G06F 3/038* (2013.01)
*G09G 5/00* (2006.01)
*G11C 8/12* (2006.01)
*G09G 3/20* (2006.01)

(52) U.S. Cl.
CPC ................ *G09G 5/003* (2013.01); *G09G 3/20* (2013.01); *G09G 2330/021* (2013.01); *G09G 2360/18* (2013.01); *G09G 2370/08* (2013.01); *G09G 2370/10* (2013.01); *G11C 8/12* (2013.01)

(58) Field of Classification Search
CPC ...................... G09G 2330/021; G09G 3/3611; G09G 2370/10; G11C 8/12
USPC .................................................. 345/204, 531
See application file for complete search history.

(56) References Cited

U.S. PATENT DOCUMENTS

| 5,617,113 | A | * | 4/1997 | Prince | .................. | G09G 3/3611 345/103 |
| 6,335,728 | B1 | * | 1/2002 | Kida | ...................... | G09G 5/399 315/169.4 |
| 6,873,311 | B2 | | 3/2005 | Yoshihara et al. | | |
| 7,768,492 | B2 | | 8/2010 | Sakamaki et al. | | |
| 8,120,599 | B2 | * | 2/2012 | Kang | ..................... | G09G 5/003 345/100 |
| 8,199,157 | B2 | * | 6/2012 | Park | .......................... | G06T 1/20 345/519 |
| 2005/0057450 | A1 | * | 3/2005 | Jeong | .................. | G09G 3/2085 345/60 |
| 2007/0097069 | A1 | | 5/2007 | Kurokawa et al. | | |
| 2011/0012907 | A1 | | 1/2011 | Sakamoto et al. | | |

(Continued)

FOREIGN PATENT DOCUMENTS

| JP | 2009-145767 A | 7/2009 |
| KR | 10-0630494 B1 | 10/2006 |
| KR | 2012-0053548 A | 5/2012 |

*Primary Examiner* — Chanh Nguyen
*Assistant Examiner* — Yuzhen Shen
(74) *Attorney, Agent, or Firm* — Harness, Dickey & Pierce

(57) ABSTRACT

A display driver integrated circuit includes a memory unit configured to store image data received from an external host, an image processing chain unit configured to perform image processing on the image data, a data driver configured to control data lines of a display panel based on the image data, and a data path selection unit configured to selectively activate, based on an operation mode of the display driver integrated circuit, one of a first data path and second data path for the image data. The first data path is formed by sequentially connecting the external host, the memory unit, the image processing chain unit and the data driver. The second data path is formed by sequentially connecting the external host, the image processing chain unit, the memory unit and the data driver.

20 Claims, 12 Drawing Sheets

(56) References Cited

U.S. PATENT DOCUMENTS

2011/0032235 A1 2/2011 Nose
2011/0199391 A1 8/2011 Olsson et al.
2012/0120057 A1 5/2012 Cho et al.
2014/0098111 A1* 4/2014 Ju ..................... H04N 19/127
　　　　　　　　　　　　　　　　　　　　345/502

* cited by examiner

DISPLAY DRIVER INTEGRATED CIRCUIT WITH MULTIPLE DATA PATHS

CROSS-REFERENCE TO RELATED APPLICATION

This application claims priority under 35 USC §119 to Korean Patent Application No. 2013-0022598, filed on Mar. 4, 2013, in the Korean Intellectual Property Office (KIPO), the contents of which are herein incorporated by reference in their entirety.

BACKGROUND

1. Technical Field

At least one example embodiment relates generally to a display device, and more particularly to a display driver integrated circuit to drive a display panel.

2. Description of the Related Art

A display device includes a display panel to display an image and a display driver integrated circuit to drive the display panel. The display driver integrated circuit receives image data from an external host, image-processes the received image data, and applies a voltage signal to a data line of the display panel based on the processed image data to drive the display panel. Recently, as the size of display panels increases, various technologies have been studied for reducing power consumption of the display driver integrated circuit.

SUMMARY

At least one example embodiment of the inventive concepts substantially alleviates one or more problems due to limitations and disadvantages of the related art.

At least one example embodiment provides a display driver integrated circuit capable of effectively changing a data path formed therein according to an operation mode.

According to at least one example embodiment, a display driver integrated circuit includes a memory unit configured to store image data received from an external host, an image processing chain unit configured to perform image processing on the image data, a data driver configured to control data lines of a display panel based on the image data, and a data path selection unit configured to selectively activate, based on an operation mode of the display driver integrated circuit, one of a first data path and second data path for the image data. The first data path is formed by sequentially connecting the external host, the memory unit, the image processing chain unit and the data driver. The second data path is formed by sequentially connecting the external host, the image processing chain unit, the memory unit and the data driver.

According to at least one example embodiment, the data path selection unit is configured to activate the first data path in a first operation mode and activate the second data path in a second operation mode.

According to at least one example embodiment, in the first operation mode, the memory unit is configured to store the image data received from the external host as stored image data, the image processing chain unit is configured to generate processed image data by performing the image processing on the stored image data received from the memory unit, and the data driver is configured to control data lines of the display panel based on the processed image data received from the image processing chain unit.

According to at least one example embodiment, in the second operation mode, the image processing chain unit is configured to generate processed image data by performing the image processing on the image data received from the external host, the memory unit is configured to store the processed image data received from the image processing chain unit as stored image data, and the data driver is configured to control data lines of the display panel based on the stored image data received from the memory unit.

According to at least one example embodiment, the display driver integrated circuit is further configured to receive a panel self-refresh mode signal in the second operation mode. In response to the received panel self-refresh mode signal, the memory unit is configured to continuously output the stored image data, and the data driver is configured to control the data lines of the display panel based on the stored image data.

According to at least one example embodiment, the data path select unit includes a first multiplexer, a second multiplexer and a third multiplexer. The first multiplexer is configured to selectively provide one of the image data received from the external host and processed image data output from the image processing chain unit to the memory unit based on a mode select signal. The second multiplexer is configured to selectively provide one of the image data received from the external host and stored image data output from the memory unit to the image processing chain unit based on the mode select signal. The third multiplexer is configured to selectively provide one of the image data and the stored image data to the data driver based on the mode select signal.

According to at least one example embodiment, if the mode select signal has a first logic level, the first multiplexer is configured to provide the image data to the memory unit, the second multiplexer is configured to provide the stored image data to the image processing chain unit, and the third multiplexer is configured to provide the processed image data to the data driver.

According to at least one example embodiment, if the mode select signal has a second logic level, the second multiplexer is configured to provide the image data to the image processing chain unit, the first multiplexer is configured to provide the processed image data to the memory unit, and the third multiplexer is configured to provide the stored image data to the data driver.

According to at least one example embodiment, the memory unit includes a GRAM (Graphic Random Access Memory).

According to at least one example embodiment, the GRAM has a storage capacity to store at least one of full frame image data and compressed frame image data.

According to at least one example embodiment, the image processing chain unit includes a plurality of image processing blocks connected with each other in a form of a cascade.

According to at least one example embodiment, each of the image processing blocks is configured to perform at least one of contents-based automatic brightness control (CABC), saturation enhancement, sharpness enhancement, image interpolation, color correction, white balance, gamma correction, and color conversion on the image data.

According to at least one example embodiment, the display driver integrated circuit further includes a gate driver configured to control gate lines of the display panel.

According to at least one example embodiment, a display driver integrated circuit includes a first image processing block configured to perform first image processing on image data received from an external host, second image processing block configured to perform a second image processing on the image data, a data driver configured to control data lines of a display panel based on the image data, and a data path selection unit configured to selectively activate, based on an operation mode of the display driver integrated circuit, one of a first data path and a second data path for the image data. The first data path is formed by sequentially connecting the external host, the first image processing block, the second image processing block and the data driver. The second data path is formed by sequentially connecting the external host, the second image processing block, the first image processing block and the data driver.

According to at least one example embodiment, the display driver integrated circuit further includes a third image processing block configured to perform third image processing on the image data. The third image processing block is connected between the second image processing block and the data driver if the data path selection unit activates the first data path. The third image processing block is connected between the external host and the second image processing block if the data path selection unit activates the second data path.

According to at least one example embodiment, a display driver integrated circuit includes a data path selector configured to selectively send, based on an operation mode of the display driver integrated circuit, image data through one of a first data path and second data path. The first data path sequentially includes a memory, an image processing block and a data driver. The second data path sequentially includes the image processing block, the memory and the data driver.

According to at least one example embodiment, the data path selector is configured to send the image data through the first data path in a first operation mode, and the data path selector is configured to send the image data through the second data path in a second operation mode. The second operation mode consumes less power than the first operation mode.

According to at least one example embodiment, the data path selector is configured to selectively send the image data through one of the first data path, the second data path, and a third data path. The third data path sequentially includes the memory and the data driver. The stored image data is stored to the memory during sending of the image data through one of the first and second data paths.

According to at least one example embodiment, the data path selector is configured to send the stored image data through the third data path in response to a self-refresh operation mode signal for performing a self-refresh operation of a display connected to the data driver.

According to at least one example embodiment, the data path selector is configured to send the stored image data through the third data path in the second operation mode.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF EXAMPLE EMBODIMENTS

Figure 1:
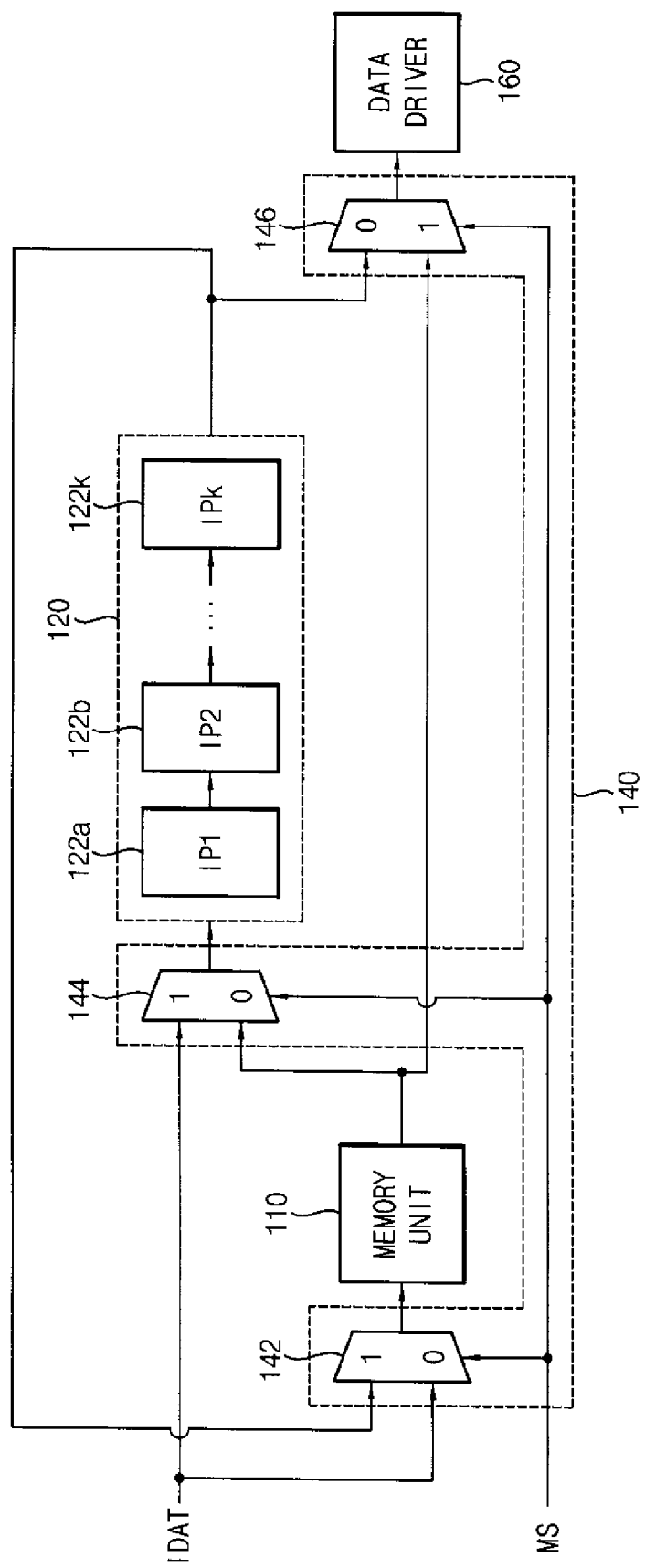
FIG. 1 is a block diagram illustrating a display driver integrated circuit according to at least one example embodiment.

Various example embodiments will be described more fully with reference to the accompanying drawings, in which embodiments are shown. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements and/or components.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a display driver integrated (DDI) circuit according to at least one example embodiment.

Referring to FIG. 1, the DDI circuit 100 includes a memory unit 110, an image processing chain unit 120, a data driver 160 and a path select unit (or data path selection unit or data path selector) 140. Although not shown in the drawing, the DDI circuit 100 may further include a controller (for instance, reference numeral 730 of FIG. 8) and a gate driver (for instance, reference numeral 750 of FIG. 8). The detailed structure of a display system including the DDI circuit 100 will be described later with reference to FIG. 8.

Figure 8:
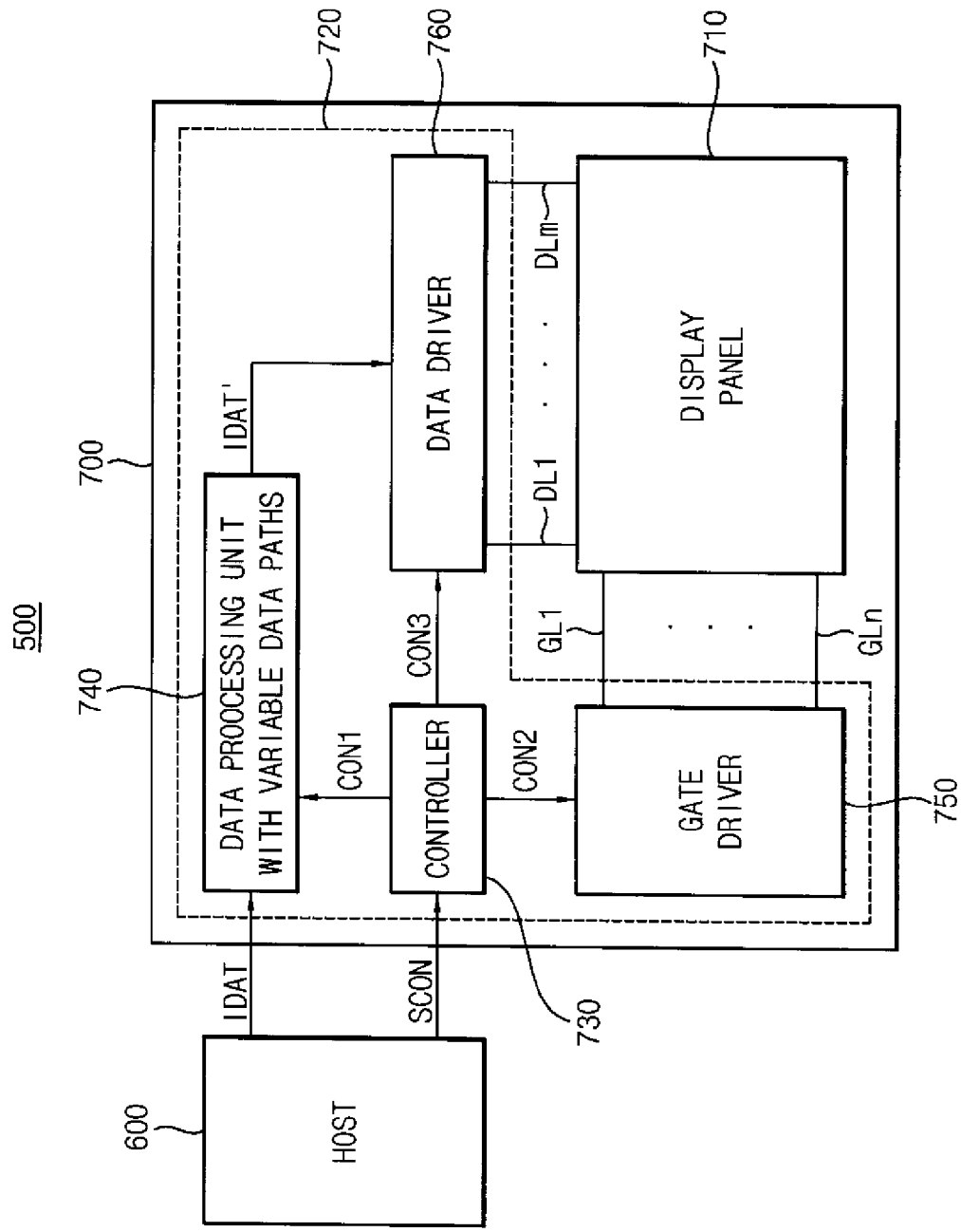
FIG. 8 is a block diagram illustrating a display system according to at least one example embodiment.

The memory unit 110 stores image data IDAT received from an external host (for instance, reference numeral 600 of FIG. 8). For instance, the memory unit 110 may include a GRAM (Graphic Random Access Memory), and may have a storage capacity to store full frame image data and/or compressed frame image data. In addition, the external host may be a central processing unit (CPU), a graphic processing unit (GPU), etc.

The image processing chain unit 120 performs the image processing on the image data IDAT. For instance, the image processing chain unit 120 may include a plurality of image processing blocks 122a, 122b, . . . , and 122k connected with each other in the form of a cascade. Each of the image processing blocks 122a, 122b, . . . , and 122k may perform at least one of various image processing schemes, such as contents-based automatic brightness control (CABC), saturation enhancement, sharpness enhancement, image interpolation, color correction, white balance, gamma correction and color conversion, etc.

The data driver 160 controls data lines of the display panel (for instance, reference numeral 710 of FIG. 8) based on the image data IDAT. For instance, the data driver 160 applies a plurality of driving voltages to the data lines of the display panel based on the image data IDAT in order to display the image corresponding to the image data IDAT on the display panel.

The path select unit 140 may selectively activate a first data path or a second data path according to the operation mode. The first data path is formed by sequentially connecting the external host, the memory unit 110, the image processing chain unit 120 and the data driver 160. The second data path is formed by sequentially connecting the external host, the image processing chain unit 120, the memory unit 110, and the data driver 160. That is, the data transmit path formed in the DDI circuit 100 may be divided into the first and second data paths based on the arrival sequence of the image data IDAT received from the external host to the memory unit 110 and the image processing chain unit 120. At this time, the memory unit 110, the image processing chain unit 120 and the path select unit 140 may constitute a data processing unit (for instance, reference numeral 740 of FIG. 8).

In at least one example embodiment, the path select unit 140 may include a first multiplexer 142, a second multiplexer 144 and a third multiplexer 146. The first multiplexer 142 may selectively provide the image data IDAT or the output of the image processing chain unit 120 to the memory unit 110 based on a mode select signal MS. The second multiplexer 144 may selectively provide the image data IDAT or the output of the memory unit 110 to the image processing chain unit 120 based on the mode select signal MS. The third multiplexer 146 may selectively provide the output of the image processing chain unit 120 or the output of the memory unit 110 to the data driver 160 based on the mode select signal MS. The mode select signal MS may be received from the external host or the controller provided in the DDI circuit 100.

In at least one example embodiment, the first data path is activated in the first operation mode and the second data path is activated in the second operation mode. The first operation mode may be a normal operation mode and the second operation mode may be a low power mode. The low power mode may be a mode in which less power is consumed by the DDI 100 compared to the normal mode. The data path activation process according to the operation mode will be described later with reference to FIGS. 2A, 2B and 2C.

Since the DDI circuit 100 according to at least one example embodiment includes the path select unit 140, DDI circuit 100 may selectively activate one of the data transmit paths provided in the DDI circuit 100 according to the operation mode. In detail, the first data path for normal (or stable) operation and the second data path for the low-power operation may be selectively activated based on the mode select signal MS. Thus, the data transmit path formed in the DDI circuit 100 may be changed in a simple way and the DDI circuit suitable for stable operation as well as low-power operation may be manufactured at a relatively low cost.

Figure 2A:
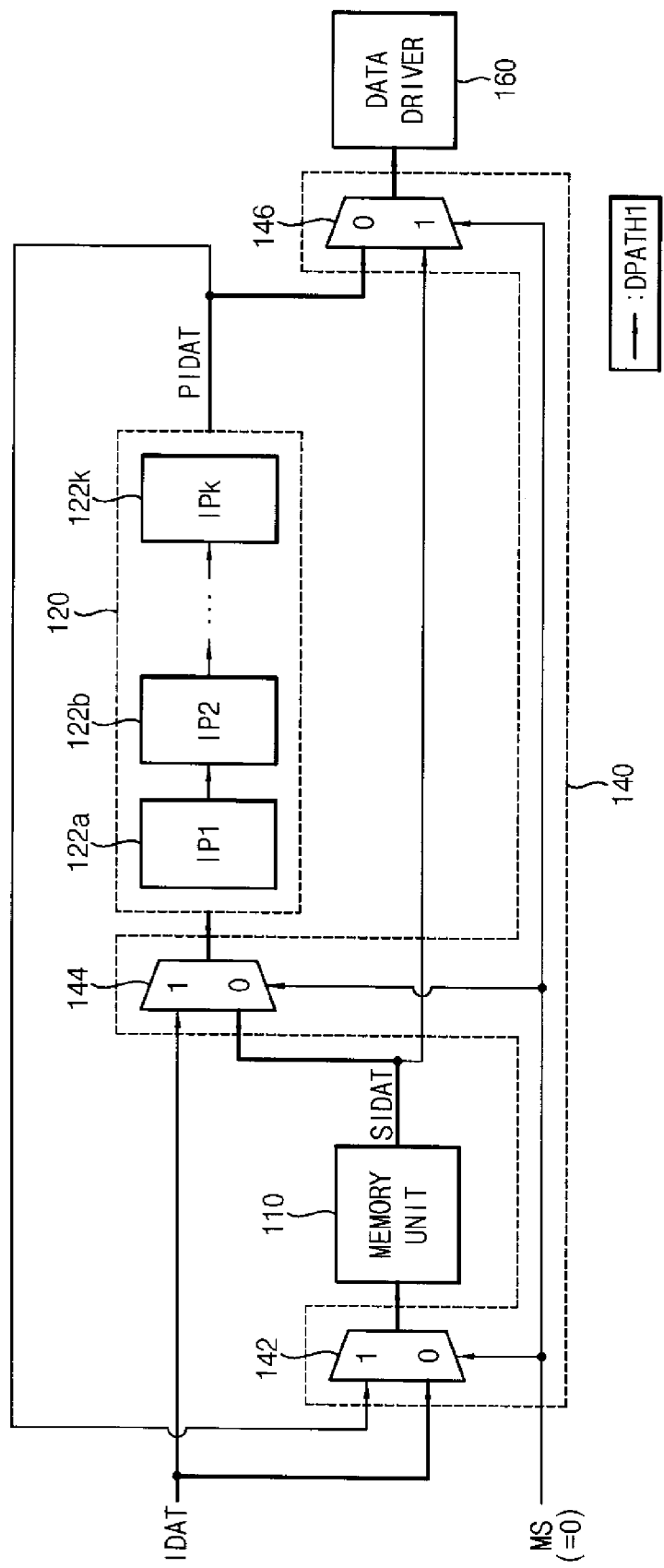
FIGS. 2A, 2B and 2C are views to explain the operation of the display driver integrated circuit of FIG. 1.
Figure 2B:
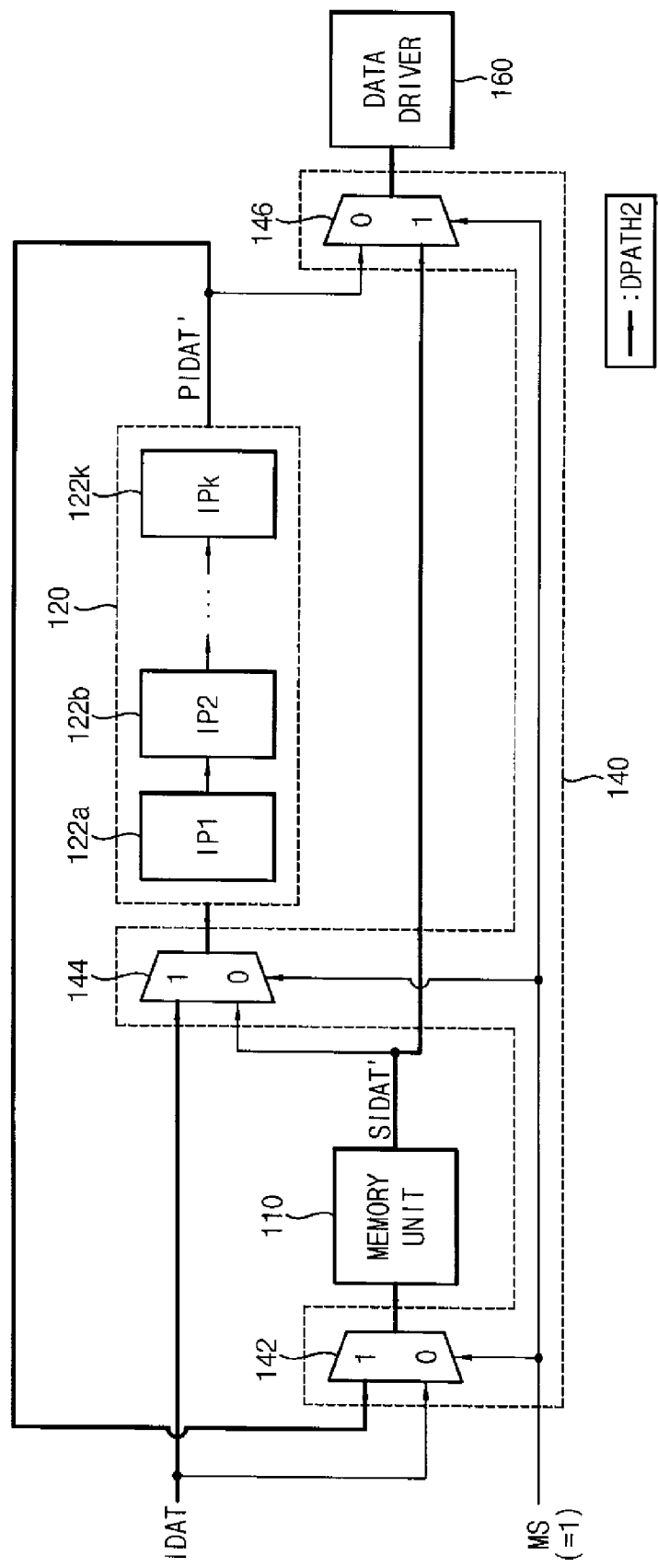
Figure 2C:
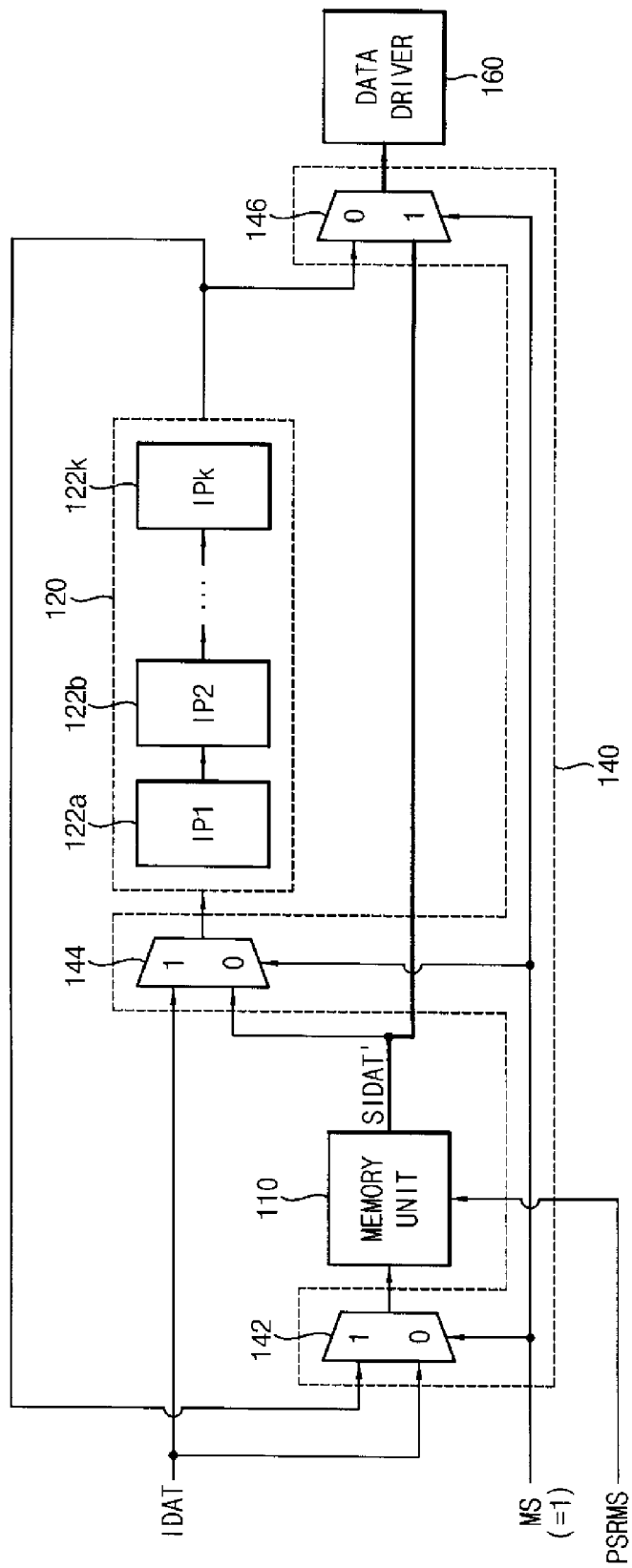

FIGS. 2A, 2B and 2C are views to explain the operation of the DDI circuit of FIG. 1. FIG. 2A illustrates the operation of the DDI circuit 100 in the first operation mode (e.g., the normal operation mode). FIG. 2B illustrates the operation of the DDI circuit 100 in the second operation mode (e.g., the low power mode). FIG. 2C illustrates the operation of the DDI circuit 100 when a panel self-refresh mode signal PSRMS is activated in the second operation mode.

Referring to FIG. 2A, the DDI circuit 100 may activate the first data path DPATH1 in the first operation mode.

In detail, the mode select signal MS may have a first logic level (for instance, '0') in the first operation mode. A value of the mode select signal MS may be set through a register (not shown) and/or a signal input/output pin (not shown). The first multiplexer 142 may provide the image data IDAT received from the external host to the memory unit 110 based on the mode select signal MS. The memory unit 110 may store the image data IDAT received from the external host as storage image data SIDAT. The second multiplexer 144 may provide the storage image data SIDAT output from the memory unit 110 to the image processing chain unit 120 based on the mode select signal MS. The image processing chain unit 120 may generate processed image data PIDAT by performing the image processing on the storage image data SIDAT received from the memory unit 110. The third multiplexer 146 may provide the processed image data PIDAT output from the image processing chain unit 120 to the data driver 160 based on the mode select signal MS. The data driver 160 may control the data lines of the display panel based on the processed image data PIDAT received from the image processing chain unit 120.

Referring to FIG. 2B, the DDI circuit 100 may activate the second data path DPATH2 in the second operation mode.

In detail, the mode select signal MS may have a second logic level (for instance, '1') in the second operation mode. The second multiplexer 144 may provide the image data IDAT received from the external host to the image processing chain unit 120 based on the mode select signal MS. The image processing chain unit 120 may generate processed image data PIDAT' by performing the image processing on the image data IDAT received from the external host. The first multiplexer 142 may provide the processed image data PIDAT' output from the image processing chain unit 120 to the memory unit 110 based on the mode select signal MS. The memory unit 110 may store the processed image data PIDAT' received from the image processing chain unit 120 as storage image data SIDAT'. The third multiplexer 146 may provide the storage image data SIDAT' output from the memory unit 110 to the data driver 160 based on the mode select signal MS. The data driver 160 may control the data lines of the display panel based on the storage image data SIDAT' received from the memory unit 110.

Referring to FIG. 2C, the DDI circuit 100 may activate a portion of the second data path DPATH2 in the panel self-refresh mode, that is, when the panel self-refresh mode signal PSRMS is activated in the second operation mode.

In detail, the DDI circuit 100 may further receive the panel self-refresh mode signal PSRMS. The panel self-refresh mode signal PSRMS may be received from the external host and/or the controller provided in the DDI circuit 100. If the panel self-refresh mode signal PSRMS is activated in the second operation mode, the DDI circuit 100 may operate in the panel self-refresh mode. That is, the DDI circuit 100 does not receive the image data IDAT from the external host, so the second multiplexer 144, the image processing chain unit 120, and the first multiplexer 142 may be inactivated. The memory unit 110 continuously outputs the storage image data SIDAT', which are stored in the second operation mode, based on the panel self-refresh mode signal PSRMS to provide the storage image data SIDAT' to the data driver 160. The third multiplexer 146 provides the storage image data SIDAT' output from the memory unit 110 to the data driver 160 based on the mode select signal MS. The data driver 160 may control the data lines of the display panel based on the storage image data SIDAT' received from the memory unit 110.

In the first operation mode described above with reference to FIG. 2A, the image data IDAT are primarily stored in the memory unit 110 and then image-processed by the image chain processing unit 120 so that the display panel may be driven based on the processed image data PIDAT output from the image chain processing unit 120. At this time, the memory unit 110 may serve as a buffer so that the image chain processing unit 120 may be stably operated. In the second operation mode described above with reference to FIG. 2B, the image data IDAT are stored in the memory unit 110 after the image data IDAT are image-processed by the image chain processing unit 120 so that the display panel may be driven based on the storage image data SIDAT' output from the memory unit 110. In the panel self-refresh mode described above with reference to FIG. 2C, the display panel is autonomously driven based on the image data stored therein (e.g., storage image data SIDAT') and the image chain processing unit 120 does not perform the image processing, so the power consumption of the DDI circuit 100 may be reduced.

Figure 3:
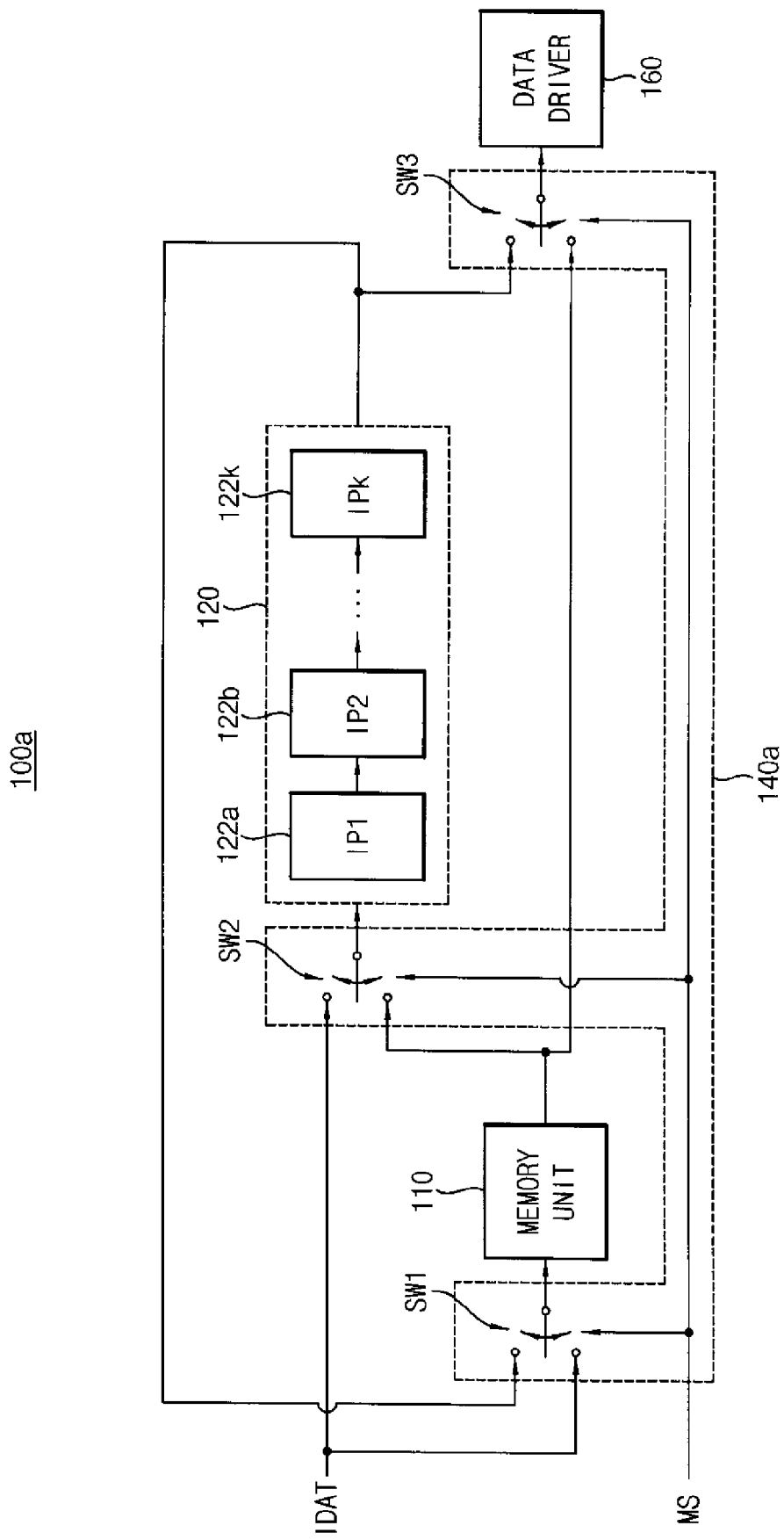
FIG. 3 is a block diagram illustrating a display driver integrated circuit according to at least one example embodiment.

FIG. 3 is a block diagram illustrating the DDI circuit according to at least one example embodiment.

Referring to FIG. 3, the DDI circuit 100a includes a memory unit 110, an image processing chain unit 120, a data driver 160 and a path select unit 140a.

The DDI circuit 100a of FIG. 3 is substantially identical to the DDI circuit 100 of FIG. 1 except for the configuration of the path select unit 140a.

The path select unit 140a may selectively activate the first data path or the second data path according to the operation mode. The path select unit 140a may include a first switch SW1, a second switch SW2 and a third switch SW3. The first switch SW1 may selectively provide the image data IDAT or the output of the image processing chain unit 120 to the memory unit 110 based on the mode select signal MS. The second switch SW2 may selectively provide the image data IDAT or the output of the memory unit 110 to the image processing chain unit 120 based on the mode select signal MS. The third switch SW3 may selectively provide the output of the image processing chain unit 120 or the output of the memory unit 110 to the data driver 160 based on the mode select signal MS.

Figure 4:
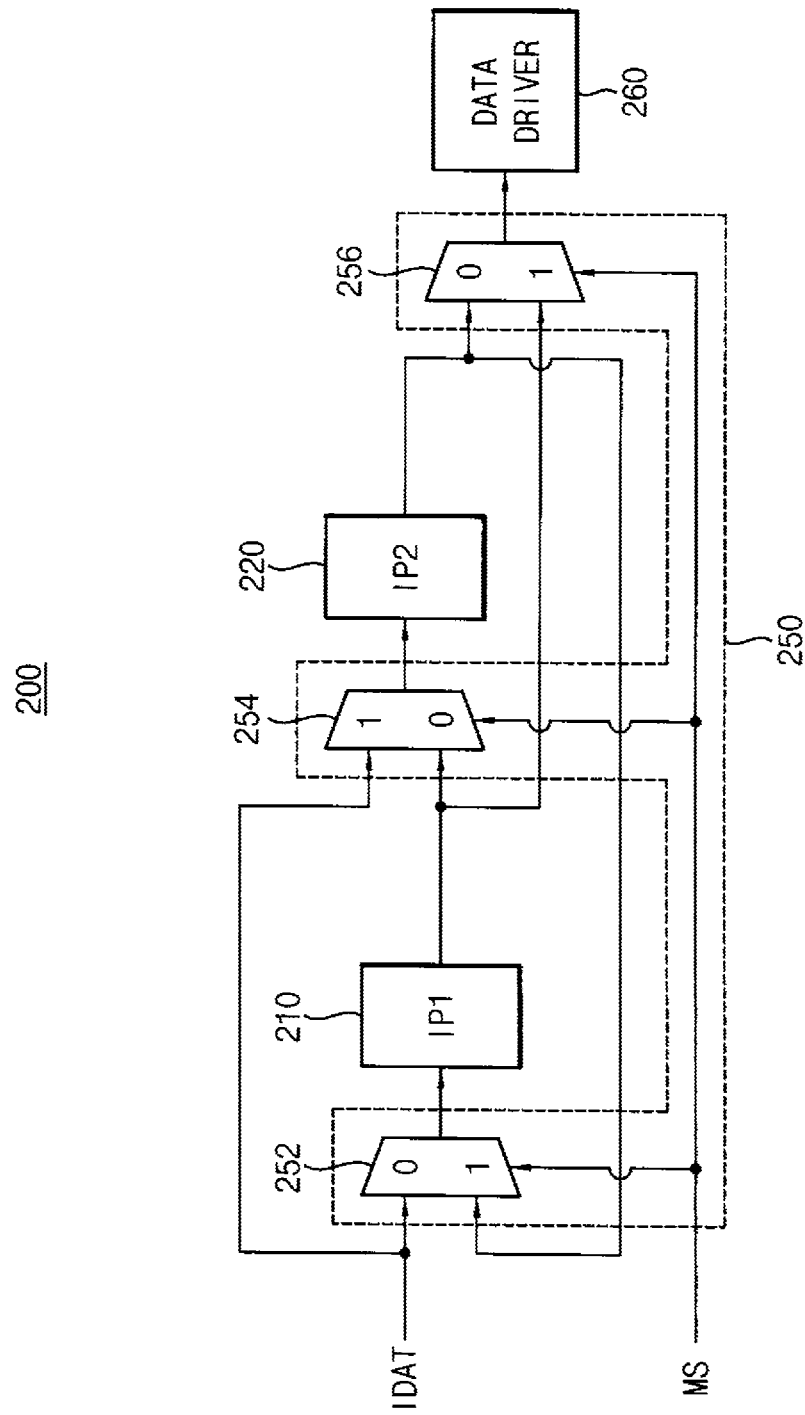
FIG. 4 is a block diagram illustrating a display driver integrated circuit according to at least one example embodiment.

FIG. 4 is a block diagram illustrating the DDI circuit according to at least one example embodiment.

Referring to FIG. 4, the DDI circuit 200 may include a first image processing block 210, a second image processing block 220, a data driver 260 and a path select unit 250. Although not shown in the drawing, the DDI circuit 200 may further include a controller (for instance, reference numeral 730 of FIG. 8), a gate driver (for instance, reference numeral 750 of FIG. 8), and a memory unit (for instance, reference numeral 110 of FIG. 1).

The first image processing block 210 may perform the first image processing on the image data IDAT received from the external host (for instance, 600 of FIG. 8). The second image processing block 220 may perform the second image processing on the image data IDAT. Each of the first and second image processing blocks 210 and 220 may perform at least one of various image processing schemes, such as contents-based automatic brightness control (CABC), saturation enhancement, sharpness enhancement, image interpolation, color correction, white balance, gamma correction, color conversion, etc. The data driver 260 controls the data lines of the display panel (for instance, reference numeral 710 of FIG. 8) based on the image data IDAT.

The path select unit 250 may selectively activate the first data path or the second data path according to the operation mode. The first data path is formed by sequentially connecting the external host, the first image processing block 210, the second image processing block 220 and the data driver 260. The second data path is formed by sequentially connecting the external host, the second image processing block 220, the first image processing block 210 and the data driver 260. That is, the data transmit path formed in the DDI circuit 200 may be divided into the first and second data paths based on the arrival sequence of the image data IDAT received from the external host to the first image processing block 210 and the second image processing block 220. At this time, the first image processing block 210, the second image processing block 220 and the path select unit 250 may constitute a data processing unit (for instance, reference numeral 740 of FIG. 8).

In at least one example embodiment, the path select unit 250 may include a first multiplexer 252, a second multiplexer 254 and a third multiplexer 256. The first multiplexer 252 may selectively provide the image data IDAT or the output of the second image processing block 220 to the first image processing block 210 based on the mode select signal MS. The second multiplexer 254 may selectively provide the image data IDAT or the output of the first image processing block 210 to the second image processing bock 220 based on the mode select signal MS. The third multiplexer 256 may selectively provide the output of the first image processing block 210 or the output of the second image processing bock 220 to the data driver 260 based on the mode select signal MS.

Meanwhile, although not shown in the drawing, the memory unit may be disposed at a front end (for instance, between an input terminal of the image data IDAT and the first multiplexer 252) of the data path or at a rear end (for instance, between the third multiplexer 256 and the data driver 260) of the data path.

Since the DDI circuit 200 according to at least one example embodiment includes the path select unit 250, the DDI circuit 200 can selectively activate the first data path or the second data path. The first data path may correspond to the first image processing scheme for performing the first image processing based on the mode select signal MS. The second data path may correspond to the second image processing scheme for performing the second image processing based on the mode select signal MS. Thus, the data transmit path (for instance, the data processing sequence) formed in the DDI circuit 200 may be changed in a simple way and a desired (or alternatively, optimum) image processing scheme may be easily adopted from among various image processing schemes.

Figure 5A:
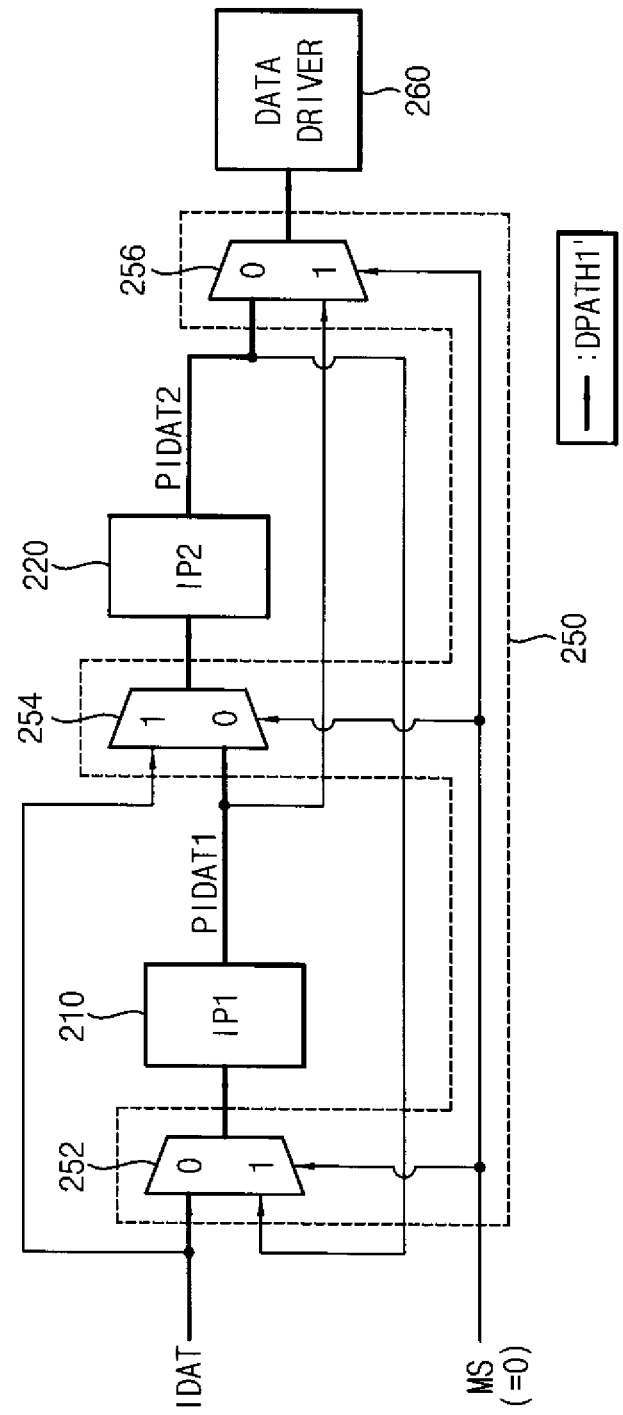
FIGS. 5A and 5B are views to explain the operation of the display driver integrated circuit of FIG. 4.
Figure 5B:
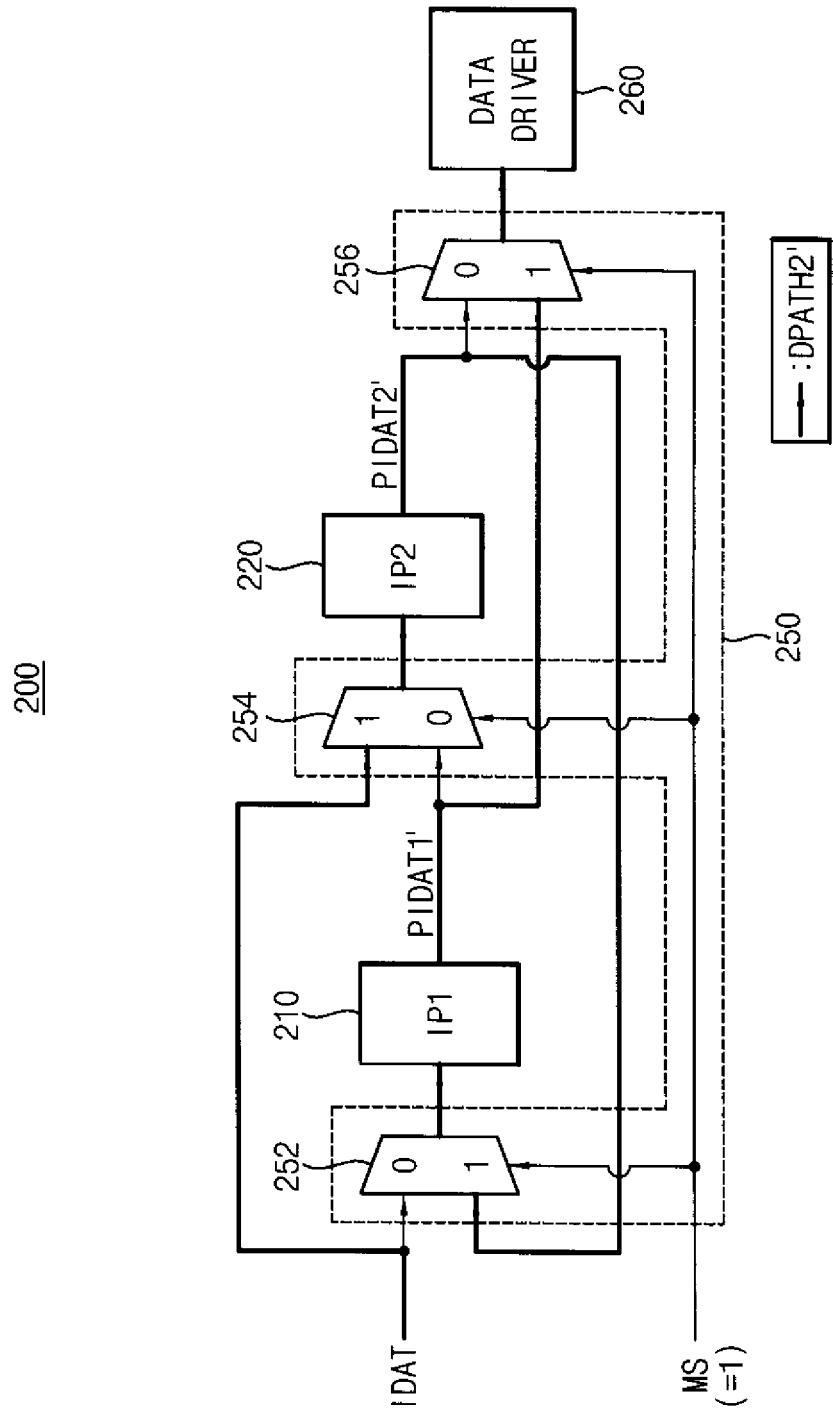

FIGS. 5A and 5B are views to explain the operation of the DDI circuit of FIG. 4.

Referring to FIG. 5A, the DDI circuit 200 may activate the first data path DPATH1' based on the mode select signal MS.

In detail, when the mode select signal MS has a first logic level (for instance, '0'), the first multiplexer 252 may provide the image data IDAT received from the external host to the first image processing block 210 based on the mode select signal MS. The first image processing block 210 may generate first processed image data PIDAT1 by performing the first image processing on the image data IDAT received from the external host. The second multiplexer 254 may provide the first processed image data PIDAT1 output from the first image processing block 210 to the second image processing block 220 based on the mode select signal MS. The second image processing block 220 may generate second processed image data PIDAT2 by performing the second image processing on the first processed image data PIDAT1 received from the first image processing block 210. The third multiplexer 256 may provide the second processed image data PIDAT2 output from the second image processing block 220 to the data driver 260 based on the mode select signal MS. The data driver 260 may control the data lines of the display panel based on the second processed image data PIDAT2 received from the second image processing block 220.

Referring to FIG. 5B, the DDI circuit 200 may activate the second data path DPATH2' based on the mode select signal MS.

In detail, when the mode select signal MS has a second logic level (for instance, '1'), the second multiplexer 254 may provide the image data IDAT received from the external host to the second image processing block 220 based on the mode select signal MS. The second image processing block 220 may generate second processed image data PIDAT2' by performing the second image processing on the image data IDAT received from the external host. The first multiplexer 252 may provide the second processed image data PIDAT2' output from the second image processing block 220 to the first image processing block 220 based on the mode select signal MS. The first image processing block 210 may generate first processed image data PIDAT1' by performing the first image processing on the second processed image data PIDAT2' received from the second image processing block 220. The third multiplexer 256 may provide the first processed image data PIDAT1' output from the first image processing block 210 to the data driver 260 based on the mode select signal MS. The data driver 260 may control the data lines of the display panel based on the first processed image data PIDAT1' received from the first image processing block 210.

As described above with reference to FIG. 5A, the first image processing may be primarily performed on the image data IDAT and then the second image processing may be performed. Otherwise, as described above with reference to FIG. 5A, the second image processing may be primarily performed on the image data IDAT and then the first image processing may be performed. A desired (or alternatively, optimum) processing scheme may be easily adopted by comparing the above two image processing schemes with each other.

Figure 6:
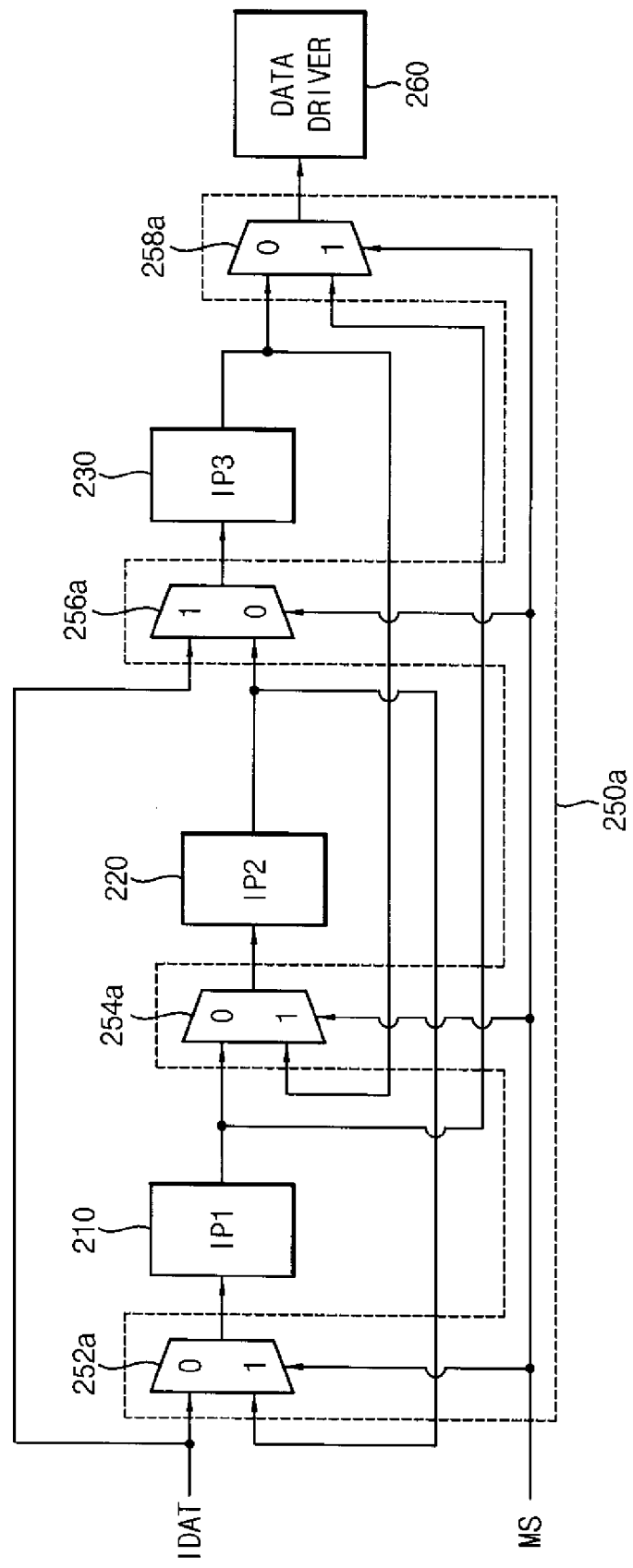
FIG. 6 is a block diagram illustrating a display driver integrated circuit according to at least one example embodiment.

FIG. 6 is a block diagram illustrating the DDI circuit according to example embodiments.

Referring to FIG. 6, the DDI circuit 200a may include a first image processing block 210, a second image processing block 220, a third image processing block 230, a data driver 260 and a path select unit 250a (or data path selection unit or data path selector).

The DDI circuit 200a of FIG. 6 is substantially identical to the DDI circuit 200 of FIG. 4 except for the third image processing block 230 and the configuration of the path select unit 250a.

The third image processing block 230 may perform the third image processing on the image data IDAT. The path select unit 250a may selectively activate the first data path or the second data path according to the operation mode. The first data path is formed by sequentially connecting the external host, the first image processing block 210, the second image processing block 220, the third image processing block 230 and the data driver 260, and the second data path is formed by sequentially connecting the external host, the third image processing block 230, the second image processing block 220, the first image processing block 210 and the data driver 260. That is, when the path select unit 250a activates the first data path, the third image processing block 230 may be connected between the second image processing block 220 and the data driver 260. In addition, when the path select unit 250a activates the second data path, the third image processing block 230 may be connected between the external host and the second image processing block 220.

In one example embodiment, the path select unit 250a may include a first multiplexer 252a, a second multiplexer 254a, a third multiplexer 256a and a fourth multiplexer 258a. The first multiplexer 252a may selectively provide the image data IDAT or the output of the second image processing block 220 to the first image processing block 210 based on the mode select signal MS. The second multiplexer 254a may selectively provide the output of the first image processing block 210 or the output of the third image processing block 230 to the second image processing bock 220 based on the mode select signal MS. The third multiplexer 256a may selectively provide the image data IDAT or the output of the second image processing bock 220 to the third image processing block 230 based on the mode select signal MS. The fourth multiplexer 258a may selectively provide the output of the first image processing block 210 or the output of the third image processing block 230 to the data driver 260 based on the mode select signal MS.

Although not shown in the drawing, the multiplexers included in the path select unit in the example embodiments of FIGS. 4 and 6 may be replaced with switches and the number of the image processing bocks and the configuration of the path select unit included in the DDI circuit may be variously changed depending on the example embodiments.

For instance, the path select unit of FIG. 6 may be implemented to perform all of six image processing schemes which can be obtained by combining the sequence of the first to third image processing schemes.

Figure 7:
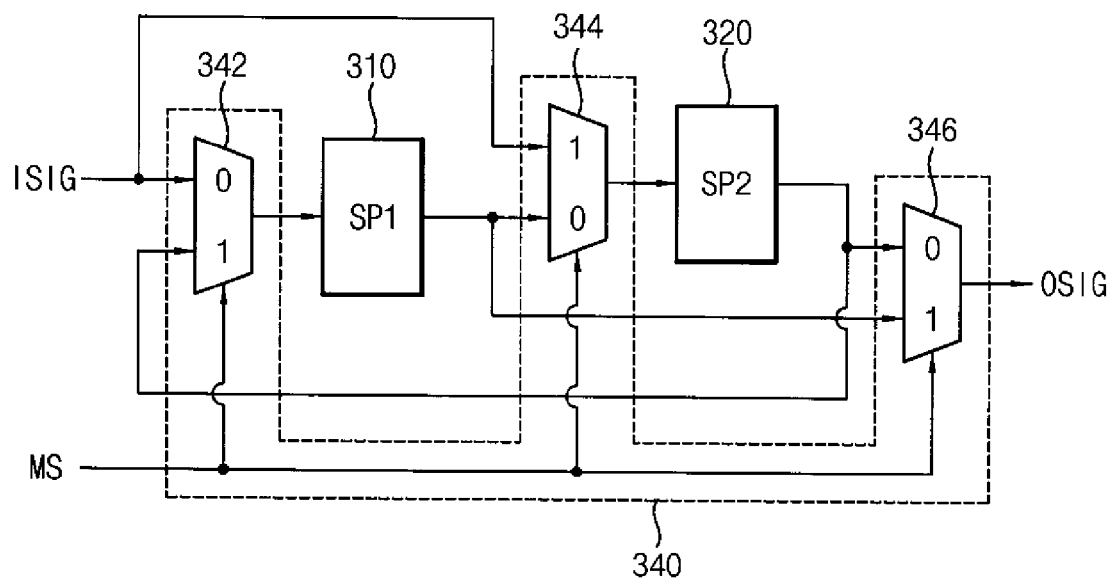
FIG. 7 is a block diagram illustrating a signal processing circuit according to at least one example embodiment.

FIG. 7 is a block diagram illustrating a signal processing circuit according to example embodiments.

Referring to FIG. 7, the signal processing circuit 300 includes a first signal processing block 310, a second signal processing block 320 and a path select unit 340.

The first signal processing block 310 performs the first signal processing on an input signal ISIG. The second signal processing block 320 performs the second signal processing on the input signal ISIG. The path select unit 340 may selectively activate a first signal path, which is formed by sequentially connecting the first signal processing block 310 and the second signal processing block 320, or a second signal path, which is formed by sequentially connecting the second signal processing block 320 and the first signal processing block 310, according to the operation mode and may provide an output signal OSIG by performing the first and second signal processing on the input signal ISIG. The path select unit 340 may include a first multiplexer 342, a second multiplexer 344, and a third multiplexer 346.

At least one example embodiment may be applicable for a normal signal processing circuit including a plurality of signal processing blocks. The signal processing circuit 300 may change the internal signal path in a simple way based on the mode select signal MS and readily adopt a desired (or alternatively, optimum) signal processing scheme from among various signal processing schemes for the input signal ISIG.

FIG. 8 is a block diagram illustrating a display system according to at least one example embodiment.

Referring to FIG. 8, the display system 500 includes a host 600 and a display device 700.

The host 600 transmits the image data IDAT and a system control signal SCON to the display device 700. The host 600 may include a processor, such as a CPU, a GPU and/or a microprocessor.

The display device 700 includes a display panel 710 and a DDI circuit 720.

The display panel 710 includes a plurality of gate lines GL1 to GLn and a plurality of data lines DL1 to DLm. A plurality of pixels are defined at intersections between the gate lines and the data lines. The pixels are aligned in the form of a matrix to form a pixel array. The display panel 710 may include an LCD (Liquid Crystal Display) panel, an LED (Light Emitting Diode) panel, an OLED (Organic LED) panel, an FED (Field Emission Display) panel, etc.

The DDI circuit 720 controls the display panel 710 to display the image corresponding to the image data IDAT. The DDI circuit 720 may include a controller 730, a data processing unit 740, a gate driver 750 and a data driver 760.

The controller 730 generates control signals CON1, CON2 and CON3 based on the system control signal SCON. For instance, the control signal CON1 may include the mode select signal MS and/or the panel self-refresh mode signal PSRMS to control the data processing unit 740. The second control signal CON2 may be a gate driver control signal to control the gate driver 750, and the third control signal CON3 may be a data driver control signal to control the data driver 760. The controller 730 may include various types of timing controllers capable of controlling the operation of the data processing unit 740, the gate driver 750 and the data driver 760.

The data processing unit 740 processes the image data IDAT. The data processing unit 740 may selectively activate an internal data transmit path based on the mode select signal MS included in the first control signal CON1. In at least one example embodiment, the data processing unit 740 may include a memory unit, an image processing chain unit, and a path select unit similar to those illustrated in FIGS. 1 and 3. In this case, the first and second data paths may be selectively activated based on first control signal CON1. The first data path may be where the image data IDAT first accesses the memory unit, and the second data path may be where the image data first accesses the image processing chain unit. Accordingly, the DDI circuit may be suitable for two different modes of operation, a stable operation mode, as well as the low-power operation mode.

In at least one example embodiment, the data processing unit 740 may include a plurality of image processing blocks and a path select unit similar to those illustrated in FIGS. 4 and 6. In this case, the first data path corresponding to the first image processing scheme for the image data IDAT or the second data path corresponding to the second image processing scheme for the image data IDAT may be selectively activated so that a desired (or alternatively, optimum) image processing scheme may be readily adopted.

Referring again to FIG. 8, the gate driver 750 controls the gate lines GL1 to GLn of the display panel 710. For instance, the gate driver 750 may selectively activate the gate lines GL1 to GLn of the display panel 710 based on the second control signal CON2 to select a row of the pixel array. The data driver 760 controls the data lines DL1 to DLm of the display panel 710 based on the processed image data IDAT' output from the data processing unit 740. For instance, the data driver 760 may apply a plurality of driving voltages to the data lines DL1 to DLm of the display panel 710 based on the third control signal CON3, the image data IDAT' and an input voltage generated from a voltage generator (not shown). The display panel 710 is driven by the gate driver 750 and the data driver 760 to display the image corresponding to the image data IDAT.

Figure 9:
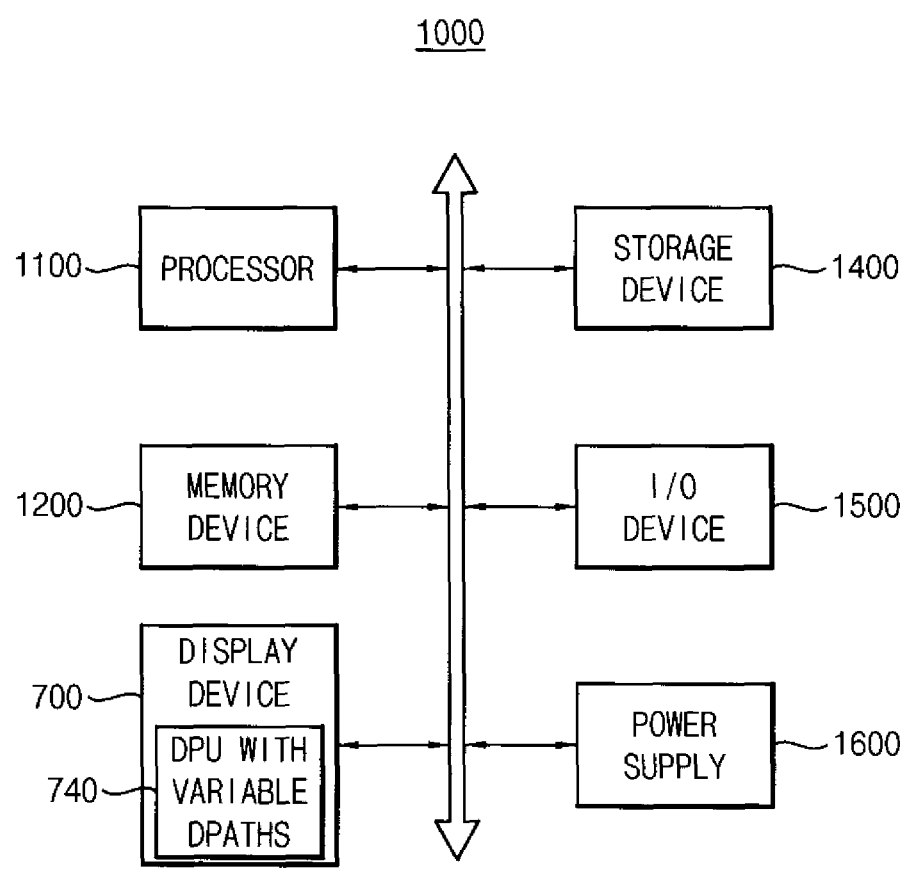
FIG. 9 is a block diagram illustrating an electronic device according to at least one example embodiment.

FIG. 9 is a block diagram illustrating an electronic device according to at least one example embodiment.

Referring to FIG. 9, the electronic device 1000 may include a processor 1100, a memory device 1200, a display device 700, a storage device 1400, an input/output device 1500 and a power supply 1600.

The processor 1100 may perform specific calculations or tasks. According to at least one example embodiment, the processor 1100 may include a micro-processor, a CPU (Central Processing Unit), a GPU (Graphic Processing Unit), etc. The processor 1100 may communicate with the memory device 1200, the display device 700, the storage device 1400 and the input/output device 1500 through an address bus, a control bus and a data bus. According to at least one example embodiment, the processor 1100 may be further connected to an expansion bus, such as a PCI (Peripheral Component Interconnect) bus.

The memory device 1200 may store data required for the operation of the electronic device 1000. For instance, the memory device 1200 may be implemented as a volatile memory device, such as a DRAM (Dynamic Random Access Memory), an SRAM (Static Random Access Memory), a mobile DRAM, etc. In addition, the memory device 1200 may be implemented as a nonvolatile memory device, such as an EEPROM (Electrically Erasable Programmable Read-Only Memory), a flash memory, a PRAM (Phase Change Random Access Memory), an RRAM (Resistance Random Access Memory), an NFGM (Nano Floating Gate Memory), a PoRAM (Polymer Random Access Memory), an MRAM (Magnetic Random Access Memory), an FRAM (Ferroelectric Random Access Memory), etc.

The storage device 1400 may include a solid state drive, a hard disk drive, a CD-ROM, etc. The input/output device 1500 may include an input unit, such as a keyboard, a keypad or a mouse, and an output unit, such as a printer. The power supply 1600 may supply an operating voltage required for the operation of the electronic device 1000.

The display device 700 may display the image and may be identical to the display device 700 of FIG. 7. The display device 700 includes the data processing unit 740, which selectively activates one of the internal data transmit paths based on the mode select signal MS to process the image data IDAT. Accordingly, the DDI circuit may be suitable for the stable operation as well as low-power operation and a desired (or alternatively, optimum) image processing scheme may be readily adopted.

According to at least one example embodiment, the electronic device 1000 and/or components of the electronic device 1000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi-chip package (MCP), wafer-level fabricated package (WFP), wafer-level processed stack package (WSP), etc.

According to at least one example embodiments, the electronic device 1000 may be any mobile system, such as a mobile phone, a smart phone, a tablet computer, a laptop computer, a PDA, a PMP, a digital camera, a portable game console, a music player, a camcorder, a video player, a navigation system, etc. According to example embodiments, the electronic device 1000 may be any computing system, such as a personal computer (PC), a server computer, a workstation, a tablet computer, a laptop computer, a mobile phone, a smart phone, a PDA, a PMP, a digital camera, a digital television, a set-top box, a music player, a portable game console, a navigation device, etc.

Although not illustrated in FIG. 9, the electronic device 1000 may further include a plurality of ports for communicating a video card, a sound card, a memory card, a universal serial bus (USB) device, other electric devices, etc. In addition, the electronic device 1000 may further include a baseband chipset, an application chipset, an image sensor, etc.

At least one example embodiment may be applied to the display device and various systems including the display device. Thus, example embodiments may be extensively applied to various electronic devices including the display device, such as a personal computer, a laptop computer, a cellular phone, a smart phone, an MP3 player, a personal digital assistant, a portable multimedia player, a digital TV and a digital camera.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concepts. Accordingly, all such modifications are intended to be included within the scope of the inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display driver integrated circuit, comprising:
a memory unit configured to store image data received from an external host;
an image processing chain unit configured to perform image processing on the image data;
a data driver configured to control data lines of a display panel based on the image data; and
a data path selection unit configured to selectively activate, based on an operation mode of the display driver integrated circuit, one of a first data path and second data path for the image data, the first data path being formed by sequentially connecting the external host, the memory unit, the image processing chain unit and the data driver, the second data path being formed by sequentially connecting the external host, the image processing chain unit, the memory unit and the data driver.

2. The display driver integrated circuit of claim 1, wherein the data path selection unit is configured to activate the first data path in a first operation mode and activate the second data path in a second operation mode.

3. The display driver integrated circuit of claim 2, wherein, in the first operation mode,
the memory unit is configured to store the image data received from the external host as stored image data,
the image processing chain unit is configured to generate processed image data by performing the image processing on the stored image data received from the memory unit, and
the data driver is configured to control data lines of the display panel based on the processed image data received from the image processing chain unit.

4. The display driver integrated circuit of claim 2, wherein, in the second operation mode,
the image processing chain unit is configured to generate processed image data by performing the image processing on the image data received from the external host,
the memory unit is configured to store the processed image data received from the image processing chain unit as stored image data, and
the data driver is configured to control data lines of the display panel based on the stored image data received from the memory unit.

5. The display driver integrated circuit of claim 4, wherein the display driver integrated circuit is further configured to receive a panel self-refresh mode signal in the second operation mode, and in response to the received panel self-refresh mode signal,
the memory unit is configured to continuously output the stored image data, and
the data driver is configured to control the data lines of the display panel based on the stored image data.

6. The display driver integrated circuit of claim 1, wherein the data path select unit includes,
a first multiplexer configured to selectively provide one of the image data received from the external host and processed image data output from the image processing chain unit to the memory unit based on a mode select signal, a second multiplexer configured to selectively provide one of the image data received from the external host and stored image data output from the memory unit to the image processing chain unit based on the mode select signal, and a third multiplexer is configured to selectively provide one of the image data and the stored image data to the data driver based on the mode select signal.

7. The display driver integrated circuit of claim 6, wherein, if the mode select signal has a first logic level,
the first multiplexer is configured to provide the image data to the memory unit,
the second multiplexer is configured to provide the stored image data to the image processing chain unit, and
the third multiplexer is configured to provide the processed image data to the data driver.

8. The display driver integrated circuit of claim 7, wherein, if the mode select signal has a second logic level,
the second multiplexer is configured to provide the image data to the image processing chain unit,
the first multiplexer is configured to provide the processed image data to the memory unit, and
the third multiplexer is configured to provide the stored image data to the data driver.

9. The display driver integrated circuit of claim 1, wherein the memory unit includes a GRAM (Graphic Random Access Memory).

10. The display driver integrated circuit of claim 9, wherein the GRAM has a storage capacity to store at least one of full frame image data and compressed frame image data.

11. The display driver integrated circuit of claim 1, wherein the image processing chain unit includes a plurality of image processing blocks connected with each other in a form of a cascade.

12. The display driver integrated circuit of claim 11, wherein each of the image processing blocks is configured to perform at least one of contents-based automatic brightness control (CABC), saturation enhancement, sharpness enhancement, image interpolation, color correction, white balance, gamma correction, and color conversion on the image data.

13. The display driver integrated circuit of claim 1, further comprising:
a gate driver configured to control gate lines of the display panel.

14. A display driver integrated circuit, comprising:
a first image processing block configured to perform first image processing on image data received from an external host;
a second image processing block configured to perform second image processing on the image data;
a data driver configured to control data lines of a display panel based on the image data; and
a data path selection unit configured to selectively activate, based on an operation mode of the display driver integrated circuit, one of a first data path and a second data path for the image data, the first data path being formed by sequentially connecting the external host, the first image processing block, the second image processing block and the data driver, the second data path being formed by sequentially connecting the external host, the second image processing block, the first image processing block and the data driver.

15. The display driver integrated circuit of claim 14, further comprising:
a third image processing block configured to perform third image processing on the image data, the third image processing block being,
connected between the second image processing block and the data driver if the data path selection unit activates the first data path, and
connected between the external host and the second image processing block if the data path selection unit activates the second data path.

16. A display driver integrated circuit, comprising:
a data path selector including a first selection circuit, a second selection circuit, and a third selection circuit, the data path selector configured to selectively send, based on an operation mode of the display driver integrated circuit, image data through one of a first data path and second data path, the first data path sequentially including the first selection circuit, a memory, the second selection circuit, an image processing block, the third selection circuit and a data driver, the second data path sequentially including the second selection circuit, the image processing block, the first selection circuit, the memory, the third selection circuit and the data driver.

17. The display driver integrated circuit of claim 16, wherein,
the data path selector is configured to send the image data through the first data path in a first operation mode, and
the data path selector is configured to send the image data through the second data path in a second operation mode, the second operation mode consuming less power than the first operation mode.

18. The display driver integrated circuit of claim 17, wherein the data path selector is configured to selectively send the image data through one of the first data path, the second data path, and a third data path, the third data path sequentially including the memory, the third selection circuit and the data driver but excluding the first selection circuit, the second selection circuit, and the image processing block, the image data sent through the third data path being stored to the memory during sending of the image data through one of the first and second data paths.

19. The display driver integrated circuit of claim 18, wherein the data path selector is configured to send the stored image data through the third data path in response to a self-refresh operation mode signal for performing a self-refresh operation of a display connected to the data driver.

20. The display driver integrated circuit of claim 19, wherein the data path selector is configured to send the stored image data through the third data path in the second operation mode.

* * * * *